USOO5700400A

United States Patent [19]
Ikai et al.

[11] Patent Number: 5,700,400
[45] Date of Patent: Dec. 23, 1997

[54] METHOD FOR PRODUCING A SEMICONDUCTING MATERIAL

[75] Inventors: Keizo Ikai; Masaki Minami; Mitsuo Matsuno, all of Yokohama, Japan

[73] Assignee: Nippon Oil Co., Ltd., Tokyo, Japan

[21] Appl. No.: 514,580

[22] Filed: Aug. 14, 1995

Related U.S. Application Data

[63] Continuation-in-part of Ser. No. 260,195, Jun. 15, 1994, abandoned.

[30] Foreign Application Priority Data

Jun. 15, 1994 [JP] Japan .................................. 5-168651

[51] Int. Cl.$^6$ .............................. H01B 1/04; H01B 1/02; C23C 16/24; C23C 16/32
[52] U.S. Cl. ...................... 252/513; 252/514; 252/512; 252/518; 252/519; 252/520; 252/516; 252/521; 427/249; 427/255; 528/15; 528/16; 528/17; 528/14; 528/18; 528/19
[58] Field of Search ............................ 528/16, 17, 18, 528/31, 14, 19, 15; 252/518, 519, 520, 521, 512, 513, 514, 515, 516; 427/249

[56] References Cited

U.S. PATENT DOCUMENTS

| | | | |
|---|---|---|---|
| 4,159,259 | 6/1979 | Yajima et al. | 528/14 |
| 4,478,654 | 10/1984 | Gau et al. | 148/174 |
| 4,594,330 | 6/1986 | Suzuki et al. | 501/92 |
| 4,906,710 | 3/1990 | Burns et al. | 528/10 X |
| 5,153,295 | 10/1992 | Whitmarsh et al. | 528/31 |
| 5,204,380 | 4/1993 | Seyferth et al. | 528/31 X |
| 5,229,481 | 7/1993 | Tilley | 528/31 X |
| 5,252,766 | 10/1993 | Sakakura et al. | 556/430 |
| 5,449,734 | 9/1995 | Kotani et al. | 528/12 |
| 5,561,231 | 10/1996 | Dauth et al. | 546/2 |

FOREIGN PATENT DOCUMENTS

| | | |
|---|---|---|
| 0 314 327 A2 | 5/1989 | European Pat. Off. . |
| 0 551 771 A2 | 7/1993 | European Pat. Off. . |
| 2 701 483 A1 | 8/1994 | France . |
| 41 10917 A1 | 10/1992 | Germany . |
| A-5 032 785 | 2/1993 | Japan . |
| A-5 320 353 | 12/1993 | Japan . |

OTHER PUBLICATIONS

European Search Report concerning European Patent Application No. Ep 94 30 4253 dated Jul. 10, 1995 (3 pages).
Chemical Abstracts, 120: 271718, Shieh, Yeong Tarng, "Studies of Hydropolysilanes as Conducting Materials and Silicon Carbide Precursors", Univ. Massachusetts, Lowell, Ma., Univ. Microfilms Int., Order No. DA 9311922, 167 pages.
*Encyclopedia of Chemical Technology*, 3rd ed. (1978), vol. 4, pp. 520–535.
West, "The Polysilane High Polymers", *Journal of Organometallic Chemistry*, 300–1/2:327–346 (1986).
Woo et al., "Dehydrogenative Polymerization of Silanes to Polysilanes by Zirconocene and Hafnocene Catalysts. A New Polymerization Mechanism", *J. Am. Chem. Soc.*, 111: 8043–4 (1989).
Corey et al., "Condensation of Primary Silanes in the Presence of Cp$_2$/$^n$BuLi(M=Ti, Zr, Hf)", *Journal of Organometallic Chemistry*, 439:1–17 (1992).

*Primary Examiner*—Douglas J. McGinty
*Attorney, Agent, or Firm*—Panitch Schwarze Jacobs & Nadel, P.C.

[57] ABSTRACT

A method for producing a semiconducting material by subjecting a hydrosilane monomer to dehydrogenative condensation followed by thermal decomposition is disclosed. The hydrosilane monomer may be a hydromonosilane, a hydrodisilane or a hydrotrisilane. The dehydrogenative condensation is conducted in the presence of a catalyst that contains at least one metal or metal compound of Groups 3B, 4B and 8 of the Periodic Table. The catalyst may be used in conjunction with a silane compound or a metal hydride. The semiconducting material that is formed may have a silicon content of 70 atomic % or more.

13 Claims, No Drawings

METHOD FOR PRODUCING A SEMICONDUCTING MATERIAL

CROSS-REFERENCE TO RELATED APPLICATION

This is a continuation-in-part application of application Ser. No. 08/260,195, filed Jun. 15, 1994, now abandoned.

FIELD OF THE INVENTION

This invention relates to a method of producing a semiconducting material for use in the formation of diods, transistors, field effect transistors, thyristors and similar semiconducting elements.

BACKGROUND OF THE INVENTION

A gas-phase crystal growth process has found extensive use in the production of thin films of amorphous silicon or compound semiconductors. According to this process, a low molecular weight feedstock, in the gaseous phase, is thermally decomposed or chemically reacted under high vacuum, to achieve deposition of a film on a substrate. However, this method would be prohibitively expensive if used to prepare large semiconductor films because it requires large-scale vacuum devices on the one hand, and provides for a limited rate of film deposition on the other.

SUMMARY OF THE INVENTION

As a result of research efforts directed toward overcoming the foregoing drawbacks of the prior art, an improved method of producing semiconducting materials at a maximum efficiency and a minimum of costs has now been found.

According to the invention, a method is provided for producing a semiconducting material. The method comprises subjecting a hydrosilane monomer to dehydrogenative condensation followed by thermal decomposition. The hydrosilane monomer is one or more of, for example, a hydromonosilane, hydrodisilane and hydrotrisilane.

The hydromonosilane has the formula (I)

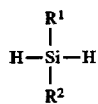

(I)

wherein $R^1$ and $R^2$ each are independently selected from the group consisting of hydrogen, $C_1$–$C_{12}$ alkyl, $C_3$–$C_{12}$ cycloalkyl, $C_1$–$C_{12}$ halogenated alkyl, $C_7$–$C_{12}$ aralkyl, $C_7$–$C_{12}$ halogenated aralkyl, $C_6$–$C_{12}$ aryl, $C_7$–$C_{12}$ alkyl substituted aryl, and silyl groups of the formula (I')

$$R^3R^4R^5Si—$$ (I')

wherein $R^3$, $R^4$ and $R^5$ each are independently selected from the group consisting of $C_1$–$C_8$ alkyl, $C_6$–$C^{10}$ aryl and $C_7$–$C^{10}$ alkyl-substituted aryl.

The hydrodisilane has the formula (II)

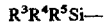

(II)

wherein $R^6$–$R^{10}$ are independently selected from the group consisting of hydrogen, $C_1$–$C_{12}$ alkyl, $C_3$–$C_{12}$ cycloalkyl, $C_1$–$C_{12}$ halogenated alkyl, $C_7$–$C_{12}$ aralkyl, $C_7$–$C_{12}$ halogenated aralkyl, $C_6$–$C_{12}$ aryl, $C_7$–$C_{12}$ alkyl substituted aryl, and silyl groups of the formula (I'), wherein at least one of $R_6$–$R_{10}$ is hydrogen.

The hydrotrisilane has the formula (III)

(III)

wherein $R^{11}$–$R^{17}$ each are independently selected from the group consisting of hydrogen, $C_1$–$C_{12}$ alkyl, $C_3$–$C_{12}$ cycloalkyl, $C_1$–$C_{12}$ halogenated alkyl, $C_7$–$C_{12}$ aralkyl, $C_7$–$C_{12}$ halogenated aralkyl, $C_6$–$C_{12}$ aryl, $C_7$–$C_{12}$ alkyl substituted aryl, and silyl groups of the formula (I'), wherein at least one of $R^{11}$–$R^{17}$ is hydrogen.

The dehydrogenative condensation occurs upon contacting one or more of the above hydrosilane compounds with a catalyst comprising at least one metal or metal compound of Groups 3B, 4B and 8 of the Periodic Table, in an amount of 0.01–10 moles of catalyst per 100 moles of the hydrosilane monomer, under conditions including a temperature of 0° C.–400° C. and a pressure of 1 mmHg to 200 kg/cm² for a time of 5 minutes to 72 hours, to provide a condensate.

The thermal decomposition results upon exposing the condensate to a temperature of 100° C.–2,000° C. in an atmosphere which is either an inert gas, a reducing atmosphere or a vacuum of $10^{-5}$–$10^{-4}$ pa, to provide a semiconducting material.

According to a preferred embodiment of the invention, the semiconducting material contains silicon in an amount of 60 atomic % or more, more preferably in an amount of 70 atomic % or more.

Preferred conditions for the dehydrogenative condensation are a temperature of 0° C. to 250° C. and/or a time of 5 minutes to 24 hours.

According to a preferred method of producing a semiconducting material according to the invention, the catalyst is combined with a silyl compound of the formula (IV)

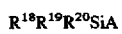

(IV)

wherein $R^{18}$, $R^{19}$ and $R^{20}$ each are selected from the group consisting of $C_1$–$C_{12}$ alkyl, $C_7$–$C_{12}$ aralkyl, $C_6$–$C_{12}$ aryl and silyl groups of the formula (I'), and A is Li, Na or K, in a catalyst to formula (IV) silyl compound of 1:0.01 to 1:100.

According to another preferred method of producing a semiconducting material according to the invention, the catalyst is combined with a metal hydride or deuteride (V) selected from the group consisting of LiX, NaX, KX, CaX₂, AlX₃, $R^{21}_{(3-p)AlX_p}$, LiAlX₄, LiAlR²²$_{(4-q)}$X$_q$, NaAlR²²$_{(4-q)}$X$_q$, Li(9-BBN)X, NaBX₄, KBX₄ and (R²¹)₄N—BX₄, wherein X is independently hydrogen or deuterium at each occurrence, $R^{21}$ is independently $C_1$–$C_5$ alkyl at each occurrence, p is 1 or 2, $R^{22}$ is independently $C_1$–$C_8$ alkyl or $C_1$–$C_8$ alkoxy where either the alkyl or alkoxy group contains 0–2 oxygen atoms present as an ether group at each occurrence, and q is 1, 2 or 3. The catalyst and metal hydride or deuteride are combined in a catalyst to formula (V) metal hydride or deuteride molar ratio of 1:0.01 to 1:100.

DETAILED DESCRIPTION OF THE PREFERRED EMBODIMENTS

The starting material for producing a semiconducting material according to the invention is one or a mixture of hydrosilane monomers such as a hydromonosilane, a hydrodisilane or a hydrodisilane.

The hydromonosilane is represented by the formula (I)

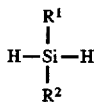

wherein $R^1$ and $R^2$ each are independently selected from the group consisting of hydrogen, $C_1$–$C_{12}$ alkyl, $C_3$–$C_{12}$ cycloalkyl, $C_1$–$C_{12}$ halogenated alkyl, $C_7$–$C_{12}$ aralkyl, $C_7$–$C_{12}$ halogenated aralkyl, $C_6$–$C_{12}$ aryl, $C_7$–$C_{12}$ alkyl substituted aryl, and silyl groups of the formula (I')

$$R^3R^4R^5Si- \quad (I')$$

wherein $R^3$, $R^4$ and $R^5$ each are independently selected from the group consisting of $C_1$–$C_8$ alkyl, $C_6$–$C^{10}$ aryl and $C_7$–$C_{10}$ alkyl-substituted aryl.

The hydrodisilane is represented by the formula (II)

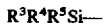

wherein $R^6$–$R^{10}$ are independently selected from the group consisting of hydrogen, $C_1$–$C_{12}$ alkyl, $C_3$–$C_{12}$ cycloalkyl, $C_1$–$C_{12}$ halogenated alkyl, $C_7$–$C_{12}$ aralkyl, $C_7$–$C_{12}$ halogenated aralkyl, $C_6$–$C_{12}$ aryl, $C_7$–$C_{12}$ alkyl substituted aryl, and silyl groups of the formula (I'), wherein at least one of $R_6$–$R_{10}$ is hydrogen.

The hydrotrisilane is represented by the formula (III)

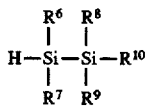

wherein $R^{11}$–$R^{17}$ each are independently selected from the group consisting of hydrogen, $C_1$–$C_{12}$ alkyl, $C_3$–$C_{12}$ cycloalkyl, $C_1$–$C_{12}$ halogenated alkyl, $C_7$–$C_{12}$ aralkyl, $C_7$–$C_{12}$ halogenated aralkyl, $C_6$–$C_{12}$ aryl, $C_7$–$C_{12}$ alkyl substituted aryl, and silyl groups of the formula (I'), wherein at least one of $R^{11}$–$R^{17}$ is hydrogen.

Examples of the hydromonosilane monomer (I) are, without limitation, silane, methylsilane, ethylsilane, n-propylsilane, (3,3,3-trifluoropropyl)silane, n-butylsilane, t-butylsilane, (1-methylpropyl)silane, (2-methylpropyl) silane, amysilane, n-hexylsilane, cyclohexylsilane, n-heptylsilane, n-octylsilane, n-nonylsilane, n-decylsilane, n-dodecylsilane, phenylsilane, p-tolylsilane, mesitylsilane, benzylsilane, phenethylsilane, (trimethylsilylmethyl)silane, dimethylsilane, diethylsilane,di-n-propylsilane, di-n-butylsilane, di-n-hexylsilane, di-n-octylsilane, diphenylsilane, dibenzylsilane, diphenethylsilane, methylphenylsilane, di-p-tolysilane, dimethylsilane, bis (trimethylsilylmethyl)silane, ethylmethylsilane, methyl-n-propylsilane, methyl(3,3,3-trifluoropropyl)silane, methyl-i-propylsilane, n-butylmethylsilane, t-butylmethylsilne, methyl(1-methylpropyl)silane, methyl(2-methylpropyl) silane, amylmethylsilane, n-hexylmethylsilane, cyclohexylmethylsilane, n-heptylmethylsilane, methyl-n-octylsilane, methyl-n-nonylsilane, n-decylmethylsilane, n-dodecylmethylsilane, methylmesitylsilane, methyl (trimethylsilylmethyi)silane, (6-methylphenethyl)silane, ethylphenylsilane, and t-butylphenylsilane.

Other examples of hydrodisilane (II) are disilane, methyldisilane, ethyldisilane, n-propyldisilane, (3,3,3-trifluoropropyl)disilane, n-butyldisilane, t-butyldisilane, (1-methyipropyl)disilane, (2-methylpropyl)disilane, amyldisilane, n-hexyldisilane, cyclohexyldisilane, n-heptyldisilane, n-octyldisilane, n-nonyldisilane, n-decyldisilane, n-dodecyldisilane, phenyldisilane, p-tolyldisilane, mesityldisilane, benzyldisilane, phenethyldisilane, (trimethylsilylmethyl)disilane, 1,1-dimethyldisilane, 1,1-diethyldisilane, 1,1-di-n-propyldisilane, 1-1,di-n-butyldisilane, 1,1-di-n-amyldisilane, 1,1-di-n-hexyldisilane, 1,1-dicyclohexyldisilane, 1,1-diphenyldisilane, 1,1-dimesityldisilane, 1,2-dimethyldisilane, 1,2-diethyldisilane, 1,2-di-n-propyldisilane, 1,2-di-n-butyldisilane, 1,2-di-n-amyldisilane, 1,2-di-n-hexyldisilane, 1,2-dicyclohexyldisilane, 1,2-diphenyldisilane, and 1,2-dimesityldisilane.

Other eligible hydrodisilane monomers include 1-ethyl-1-methyldisilane, 1-methyl-1-n-propyldisilane, 1-methyl-1-i-propyldisilane, 1-n-butyl-1-methyl-disilane, 1-t-butyl-1-methyldisilane, 1-n-hexyl-1-methyldisilane, 1-cyclohexyl-1-methyldisilane, 1-n-heptyl-1-methyldisilane, 1-methyl-1-n-octyldisilane, 1-n-decyl-1-methyldisilane, 1-methyl-1-phenyldisilane, 1-(p-methylphenethyl)-1-methyldisilane, 1-methyl-1-(β-phenethyl)disilane, 1-p-tolyl-1-methyldisilane, 1-phenyl-1-ethyldisilane, 1-t-butyl-1-phenyldisilane, 1-(phenyldimethylsilyl)-1-methyldisilane, 1-(trimethylsilyl)-1-methyldisilane, 1-ethyl-2-methyldisilane, 1-methyl-2-n-propyldisilane, 1-methyl-2-i-propyldisilane, 1-n-butyl-2-methyldisilane, 1-t-butyl-2-methyldisilane, 1-n-hexyl-2-methyldisilane, 1-cyclohexyl-2-methyldisilane, 1-n-heptyl-2-methyldisilane, 1-methyl-2-n-octyldisilane, 1-n-decyl-2-methyldisilane, 1-methyl-2-phenyldisilane, 1-(p-methylphenethyl)-2-methyldisilane, 1-methyl-2-(β-phenethyl)disilane, 1-p-tolyl-2-methyldisilane, 1-phenyl-2-ethyldisilane, 1-t-butyl-2-phenyldisilane, 1-(phenyldimethylsilyl)-2-methyldisilane, 1-(trimethylsilyl)-2-methyldisilane, trimethylsilyldisilane, triphenylsilyldisilane, (t-butyldimethylsilyl)disilane, 1,1,2-trimethyldisilane, 1,1,2-triethyldisilane, 1,1,2-tri-n-propyldisilane, 1,1,2-tri-n-butyldisilane, 1,1,2-tri-n-amyldisilane, 1,1,2-tri-n-hexyldisilane, 1,1,2-tricyclohexyldisilane, 1,1,2-triphenyldisilane, 1,1,2-trimesityldisilane, 1,1-diethyl-2-methyldisilane, 1,1-dimethyl-2-n-propyldisilane, 1,1-dimethyl-2-i-propyldisilane, 1,1-di-n-butyl-2-methyldisilane, 1,1-di-t-butyl-2-methyldisilane, 1,1-di-n-hexyl-2-methyldisilane, 1,1-dicyclohexyl-2-methyldisilane, 1,1-di-n-heptyl-2-methyldisilane, 1,1-dimethyl-2-n-octyldisilane, 1,1-di-n-decyl-2-methyldisilane, 1,1-dimethyl-2-phenyldisilane, 1,1-di-(p-methylphenethyl)-2-methyldisilane, 1,1-dimethyl-2-(β-phenethyl)disilane, 1,1-di-p-tolyl-2-methyldisilane, 1,1-diphenyl-2-ethyldisilane, 1,1-di-t-butyl-2-phenyldisilane, 1,1-di(phenyldimethylsilyl)-2-methyldisilane, 1,1-bis (trimethylsilyl)-2-methyldisilane, 1-ethyl-2,2-dimethyldisilane, 1-methyl-2,2-di-n-propyldisilane, 1-methyl-2,2-di-i-propyldisilane, 1-n-butyl-2,2-dimethyldisilane, 1-t-butyl-2,2-dimethyldisilane, 1-n-hexyl-2,2-dimethyldisilane, 1-cyclohexyl-2,2-dimethyldisilane, 1-n-heptyl-2,2-dimethyldisilane, 1-methyl-2,2-di-n-octyldisilane, 1-n-decyl-2,2-dimethyldisilane, 1-methyl-2,2-diphenyldisilane, 1-(p-methylphenethyl)-2,2-dimethyldisilane, 1-methyl-2,2-di(β-phenethyl)disilane, 1-p-tolyl-2,2-dimethyldisilane, 1-phenyl-2,2-diethyldisilane, 1-t-butyl-2,2-diphenyldisilane, 1-(phenyldimethylsilyl)-2, 2-dimethyldisilane, 1-(trimethylsilyl)-2,2-dimethyldisilane, 1,1,1,2-tetramethyldisilane, 1,1,1,2-tetraethyldisilane, 1,1,1,2-tetra-n-propyldisilane, 1,1,1,2-tetra-n-butyldisilane, 1,1,1,2-tetra-n-amyldisilane, 1,1,1,2-tetra-n-hexyldisilane, 1,1,1,2-tetracyclohexyldisilane, 1,1,1,2-tetraphenyldisilane, 1,1,1,2- tetramethyldisilane, 1,1,2,2-tetramethyldisilane, 1,1,2,2-tetraethyldisilane, 1,1,2,2-tetra-n-propyldisilane, 1,1,2,2-tetra-n-butyldisilane, 1,1,2,2-tetra-n-amyldisilane, 1,1,2,2-tetra-n-hexyldisilane, 1,1,2,2-tetracyclohexyldisilane, 1,1,2,2-tetraphenyldisilane, 1,1,2,2-tetramesityldisilane, 1,1,1-triethyl-2-methyldisilane, 1,1,1-trimethyl-2-n-propyldisilane, 1,1,1-trimethyl-2-i-propyldisilane, 1,1,1-tri-n-butyl-2-methyldisilane, 1,1,1-tri-t-butyl-2-methyldisilane, 1,1,1-tri-n-hexyl-2-methyldisilane, 1,1,1-tricyclohexyl-2-methyldisilane, 1,1,1-n-heptyl-2-methyldisilane, 1,1,1-trimethyl-2-n-octyldisilane, 1,1,1-tri-n-decyl-2-methyldisilane, 1,1,1-trimethyl-2-phenyldisilane, 1,1,1-tri-(p-methylphenethyl)-2-methyldisilane, 1,1,1-trimethyl-2-(β-phenethyl)disilane, 1,1,1-tri-p-tolyl-2-methyldisilane, 1,1,1-triphenyl-2-ethyldisilane, 1,1,1-tri-t-butyl-phenyldisilane, 1,1,1-tri(phenyldimethyl)-2-methyldisilane, 1,1,1-tri(trimethylsilyl)-2-methyldisilane, 1-ethyl-2,2,2-trimethyldisilane, 1-methyl-2,2,2-tri-n-propyldisilane, 1-methyl-2,2,2-tri-i-propyldisilane, 1-n-butyl-2,2,2-trimethyldisilane, 1-t-butyl-2,2,2-trimethyldisilane, 1-n-hex-n-hexyl-2,2,2-trimethyldisilane, 1-cyclohexyl-2,2,2-trimethyldisilane, 1-n-heptyl-2,2,2-trimethyldisilane, 1-methyl-2,2,2-tri-n-octyldisilane, 1-n-decyl-2,2,2-trimethyldisilane, 1-methyl-2,2,2-triphenyldisilane, 1-(p-methylphenethyl)-2,2,2-trimethyldisilane, 1-methyl-2,2,2-tri(β-phenethyl)disilane, 1-p-tolyl-2,2,2-trimethyldisilane, 1-phenyl-2,2,2-triethyldisilane, 1-t-butyl-2,2,2-triphenyldisilane, 1-(phenyldimethylsilyl)-2,2,2-trimethyldisilane, 1-(trimethylsilyl)-2,2,2-trimethyldisilane, 1,1-diethyl-2,2-dimethyldisilane, 1,1-dimethyl-2,2-di-n-propyldisilane, 1,1-dimethyl-2,2-di-i-propyldisilane, 1,1-di-n-butyl-2,2-dimethyldisilane, 1,1-di-t-butyl-2,2-dimethyldislane, 1,1-di-n-hexyl-2,2-dimethyldisilane, 1,1-dicyclohexyl-2,2-dimethyldisilane, 1,1-di-n-heptyl-2,2-dimethyldisilane, 1,1-dimethyl-2,2-di-n-octyldisilane, 1,1-di-n-decyl-2,2-dimethyldisilane, 1,1-dimethyl-2,2-diphenyldisilane, 1,1-di-(p-methylphenethyl)-2,2-dimethyldisilane, 1,1-dimethyl-2,2-di(β-phenethyl)disilane, 1,1-di-p-tolyl-2,2-dimethyldisilane, 1,1-diphenyl-2,2-diethyldisilane, 1,1-di-t-butyl-2,2-diphenyldisilane, 1,1-di(phenyldimethylsilyl)-2,2-dimethyldisilane, 1,1-bis(trimethylsilyl)-2,2-dimethyldisilane, 1,2-diethyl-1,2-dimethyldisilane, 1,2-dimethyl-1,2-di-n-propyldisilane, 1,2-dimethyl-1,2-di-i-propyldisilane, 1,2-di-n-butyl-1,2-dimethyldisilane, 1,2-di-t-butyl-1,2-dimethyldisilane, 1,2-di-n-hexyl-1,2-dimethyldisilane, 1,2-dicyclohexyl-1,2-dimethyldisilane, 1,2-di-n-heptyl-1,2-dimethyldisilane, 1,2-dimethyl-1,2-di-n-octyldisilane, 1,2-di-n-decyl-1,2-dimethyldisilane, 1,2-dimethyl-1,2-diphenyldisilane, 1,2-di-(p-methylphenethyl)-1,2-dimethyldisilane, 1,2-dimethyl-1,2-di(β-phenethyl)disilane, 1,2-di-p-tolyl-1,2-dimethyldisilane, 1,2-diphenyl-1,2-diethyldisilane, 1,2-di-t-butyl-1,2-diphenyldisilane, and 1,2-di(phenyldimethylsilyl)-1,2-dimethyldisilane.

Examples of the hydrotrisilane monomer (III) include, without limitation, trisilane, 1-methyltrisilane, 1-ethyltrisilane, 1-n-propyltrisilane, 1-(3,3,3-trifluoropropyl)trisilane, 1-n-butyltrisilane, 1-t-butyltrisilane, 1-(1-methylpropyl)trisilane, 1-(2-methylpropyl)trisilane, 1-amyltrisilane, 1-n-hexyltrisilane, 1-cyclohexyltrisilane, 1-n-heptyltrisilane, 1-n-octyltrisilane, 1-n-nonyltrisilane, 1-n-decyltrisilane, 1-n-dodecyltrisilane, 1-phenyltrisilane, 1-p-tolyltrisilane, 1-mesityltrisilane, 1-benzyltrisilane, 1-phenethyltrisilane, 1-(trimethylsilylmethyl)trisilane, 2-methyltrisilane, 2-ethyltrisilane, 2-n-propyltrisilane, 2-(3,3,3-trifluoropropyl)trisilane, 2-n-butyltrisilane, 2-t-butyltrisilane, 2-(1-methylpropyl)trisilane, 2-(2-methylpropyl)trisilane, 2-amyltrisilane, 2-n-hexyltrisilane, 2-cyclohexyltrisilane, 2-n-heptyltrisilane, 2-n-octyltrisilane, 2-n-nonyltrisilane, 2-n-decyltrisilane, 2-n-dodecyltrisilane, 2-phenyltrisilane, 2-p-tolyltrisilane, 2-mesityltrisilane, 2-benzyltrisilane, 2-phenethyltrisilane, 2-(trimethylsilylmethyl)trisilane, 1,1-dimethyltrisilane, 1,1-diethyltrisilane, 1,1-di-n-propyltrisilane, bis(3,3,3-trifluoropropyl)trisilane, 1,1-di-n-butyltrisilane, 1,1-di-t-butyltrisilane, di(1-methylpropyl)trisilane, di(2-methylpropyl)trisilane, 1,1-diamyltrisilane, 1,1-di-n-hexyltrisilane, 1,1-dicyclohexyltrisilane, 1,1-di-n-heptyltrisilane, 1,1-di-n-octyltrisilane, 1,1-di-n-nonyltrisilane, 1,1-di-n-decyltrisilane, 1,1-di-n-dodecyltrisilane, 1,1-diphenyltrisilane, 1,1-di-p-tolyltrisilane, 1,1-dimethyltrisilane, 1,1-dibenzyltrisilane, 1,1-diphenethyltrisilane, 1,1-bis(trimethylsilylmethyl)trisilane, 1,2-dimethyltrisilane, 1,2-diethyltrisilane, 1,2-di-n-propyltrisilane, bis(3,3,3-trifluoropropyl)trisilane, 1,2-di-n-butyltrisilane, 1,2-di-t-butyltrisilane, di(1-methylpropyl)trisilane, di(2-methylpropyl)trisilane, 1,2-diamyltrisilane, 1,2-di-n-hexyltrisilane, 1,2-dicyclohexyltrisilane, 1,2-di-n-heptyltrisilane, 1,2-di-n-octyltrisilane, 1,2-di-n-nonyltrisilane, 1,2-di-n-decyltrisilane, 1,2-di-n-dodecyltrisilane, 1,2-diphenyltrisilane, 1,2-di-p-tolyltrisilane, 1,2-dimesityltrisilane, 1,2-dibenzyltrisilane, 1,2-diphenethyltrisilane, 1,2-bis(trimethylsilylmethyl)trisilane, 1,3-dimethyltrisilane, 1,3-diethyltrisilane, 1,3-di-n-propyltrisilane, bis(3,3,3-trifluoropropyl)trisilane, 1,3-di-n-butyltrisilane, 1,3-di-t-butyltrisilane, di(1-methylpropyl)trisilane, di(2-methylpropyl)trisilane, 1,3-diamyltrisilane, 1,3-di-n-hexyltrisilane, 1,3-dicyclohexyltrisilane, 1,3-di-n-heptyltrisilane, 1,3-di-n-octyltrisilane, 1,3-di-n-nonyltrisilane, 1,3-di-n-decyltrisilane, 1,3-di-n-dodecyltrisilane, 1,3-diphenyltrisilane, 1,3-di-p-tolyltrisilane, 1,3-dimethyltrisilane, 1,3-dibenzyltrisilane, 1,3-diphenethyltrisilane, 1,3-bis(trimethylsilylmethyl)trisilane, 1,1,1-trimethyltrisilane, 1,1,1-triethyltrisilane, 1,1,1-tri-n-propyltrisilane, 1,1,1-tris(3,3,3-trifluoropropyl)trisilane, 1,1,1-tri-n-butyltrisilane, 1,1,1-tri-t-butyltrisilane, 1,1,1-tri(1-methylpropyl)trisilane, 1,1,1-tri(2-methylpropyl)trisilane, 1,1,1-triamyltrisilane, 1-tri-n-hexyltrisilane, 1,1,1-tricyclohexyltrisilane, 1,1,1-tri-n-heptyltrisilane, 1,1,1-tri-n-octyltrisilane, 1,1,1-tri-n-nonyltrisilane, 1,1,1-tri-n-decyltrisilane, 1,1,1-tri-n-dodecyltrisilane, 1,1,1-triphenyltrisilane, 1,1,1-tri-p-tolyltrisilane, 1,1,1-trimesityltrisilane, 1,1,1-tribenzyltrisilane, 1,1,1-triphenethyltrisilane, 1,1,1-tris(trimethylsilylmethyl)trisilane, 1-ethyl-1,1-dimethyltrisilane, 1-methyl-1,1-di-n-propyltrisilane, 1-methyl-1,1-bis(3,3,3-trifluoropropyl)trisilane, 1-methyl-1,1-di-i-propyltrisilane, 1-n-butyl-1,1-dimethyltrisilane, 1-t-butyl-1,1-dimethyltrisilane, 1-methyl-1,1-di(1-methylpropyl)trisilane, 1-methyl-1,1-di(2-methylpropyl)trisilane, 1-amyl-1,1-dimethyltrisilane, 1-n-hexyl-1,1-dimethyltrisilane, 1-cyclohexyl-1,1-dimethyltrisilane, 1-n-heptyl-1,1-dimethyltrisilane, 1-methyl-1,1-di-n-octyltrisilane, 1-methyl-1,1-di-n-nonyltrisilane, 1-n-decyl-1,1-dimethyltrisilane, 1-n-dodecyl-1,1-dimethyltrisilane, 1-methyl-1,1-diphenyltrisilane, 1-p-tolyl-1,1-dimethyltrisilane, 1-methyl-1,1-dimethyltrisilane, 1-benzyl-1,1-dimethyltrisilane, 1-methyl-1,1-diphenethyltrisilane, 1-methyl-1,1-bis(trimethylsilylmethyl)trisilane, 1-(p-methylphenethyl)-1,1-dimethyltrisilane and 1-ethyl-1,1-diphenyltrisilane.

Other eligible hydrotrisilane monomers include 1-ethyl-1-methyltrisilane, 1-methyl-1-n-propyltrisilane, 1-methyl-1-(3,3,3-trifluoropropyl)trisilane, 1-methyl-1-i- propyltrisilane, 1-n-butyl-1-methyltrisilane, 1-t-butyl-1-methyltrisilane, 1-methyl-1-(1-methylpropyl)trisilane, 1-methyl-1-(2-methylpropyl)trisilane, 1-amyl-1-methyltrisilane, 1-n-hexyl-1-methyltrisilane, 1-cyclohexyl-1-methyltrisilane, 1-n-heptyl-1-methyltrisilane, 1-methyl-1-n-octyltrisilane, 1-methyl-1-n-nonyltrisilane, 1-n-decyl-1-methyltrisilane, 1-n-dodecyl-1-methyltrisilane, 1-methyl-1-phenyltrisilane, 1-p-tolyl-1-methyltrisilane, 1-mesityl-1-methyltrisilane, 1-benzyl-1-methyltrisilane, 1-methyl-1-phenethyltrisilane, 1-methyl-1-(trimethylsilylmethyl)trisilane, 1-(p-methylphenethyl)-1-methyltrisilane, 1-ethyl-1-phenyltrisilane, 1-t-butyl-1-phenyltrisilane, 1-ethyl-2-methyltrisilane, 1-methyl-2-n-propyltrisilane, 1-methyl-2-(3,3,3-trifluoropropyl)trisilane, 1-methyl-2-i-propyltrisilane, 1-n-butyl-2-methyltrisilane, 1-t-butyl-2-methyltrisilane, 1-methyl-2-(1-methylpropyl)trisilane, 1-methyl-2-(2-methylpropyl)trisilane, 1-amyl-2-methyltrisilane, 1-n-hexyl-2-methyltrisilane, 1-cyclohexyl-2-methyltrisilane, 1-n-heptyl-2-methyltrisilane, 1-methyl-2-n-octyltrisilane, 1-methyl-2-n-nonyltrisilane, 1-n-decyl-2-methyltrisilane, 1-n-dodecyl-2-methyltrisilane, 1-methyl-2-phenyltrisilane, 1-p-tolyl-2-methyltrisilane, 1-methyl-2-mesityltrisilane, 1-benzyl-2-methyltrisilane, 1-methyl-2-phenethyltrisilane, 1-methyl-2-(trimethylsilylmethyl)trisilane, 1-(p-methylphenethyl)-2-methyltrisilane, 1-ethyl-2-phenyltrisilane, 1-t-butyl-2-phenyltrisilane, 1-ethyl-3-methyltrisilane, 1-methyl-3-n-propyltrisilane, 1-methyl-3-(3,3,3-trifluoropropyl)trisilane, 1-methyl-3-i-propyltrisilane, 1-n-butyl-3-methyltrisilane, 1-t-butyl-3-methyltrisilane, 1-methyl-3-(1-methylpropyl)trisilane, 1-methyl-3-(2-methylpropyl)trisilane, 1-amyl-3-methyltrisilane, 1-n-hexyl-3-methyltrisilane, 1-cyclohexyl-3-methyltrisilane, 1-n-heptyl-3-methyltrisilane, 1-methyl-3-n-octyltrisilane, 1-methyl-3-n-nonyltrisilane, 1-n-decyl-3-methyltrisilane, 1-n-dodecyl-3-methyltrisilane, 1-methyl-3-phenyltrisilane, 1-p-tolyl-3-methyltrisilane, 1-methyl-3-mesityltrisilane, 1-benzyl-3-methyltrisilane, 1-methyl-3-phenethyltrisilane, 1-methyl-3-(trimethylsilylmethyl)trisilane, 1-(p-methylphenethyl)-3-methyltrisilane, 1-ethyl-3-phenyltrisilane, 1-t-butyl-3-phenyltrisilane, 1,1,2-trimethyltrisilane, 1,1,2-triethyltrisilane, 1,1,2-tri-n-propyltrisilane, 1,1,2-tris(3,3,3-trifluoropropyl)trisilane, 1,1,2-tri-n-butyltrisilane, 1,1,2-tri-t-butyltrisilane, 1,1,2-tri(1-methylpropyl)trisilane, 1,1,2-tri(2-methylpropyl)trisilane, 1,1,2-triamyltrisilane, 1,1,2-tri-n-hexyltrisilane, 1,1,2-tricyclohexyltrisilane, 1,1,2-tri-n-heptyltrisilane, 1,1,2-tri-n-octyltrisilane, 1,1,2-tri-n-nonyltrisilane, 1,1,2-tri-n-decyltrisilane, 1,1,2-tri-n-dodecyltrisilane, 1,1,2-triphenyltrisilane, 1,1,2-tri-p-tolyltrisilane, 1,1,2-trimethyltrisilane, 1,1,2-tribenzyltrisilane, 1,1,2-triphenethyltrisilane, 1,1,2-tris(trimethylsilylmethyl)trisilane, 1,1,3-trimethyltrisilane, 1,1,3-triethyltrisilane, 1,1,3-tri-n-propyltrisilane, 1,1,3-tris(3,3,3-trifluoropropyl)trisilane, 1,1,3-tri-n-butyltrisilane, 1,1,3-tri-t-butyltrisilane, 1,1,3-tri(1-methylpropyl)trisilane, 1,1,3-tri(2-methylpropyl)trisilane, 1,1,3-triamyltrisilane, 1,1,3-tri-n-hexyltrisilane, 1,1,3-tricyclohexyltrisilane, 1,1,3-tri-n-heptyltrisilane, 1,1,3-tri-n-octyltrisilane, 1,1,3-tri-n-nonyltrisilane, 1,1,3-tri-n-decyltrisilane, 1,1,3-tri-n-dodecyltrisilane, 1,1,3-triphenyltrisilane, 1,1,3-tri-p-tolyltrisilane, 1,1,3-trimesityltrisilane, 1,1,3-tribenzyltrisilane, 1,1,3-triphenethyltrisilane, 1,1,3-tris(trimethylsilylmethyl)trisilane, 1,2,3-trimethyltrisilane, 1,2,3-triethyltrisilane, 1,2,3-tri-n-propyltrisilane, 1,2,3-tris(3,3,3-trifluoropropyl)trisilane, 1,2,3-tri-n-butyltrisilane, 1,2,3-tri-t-butyltrisilane, 1,2,3-tri(1-methylpropyl)trisilane, 1,2,3-tri(2-methylpropyl)trisilane, 1,2,3-triamyltrisilane, 1,2,3-tri-n-hexyltrisilane, 1,2,3-tricyclohexyltrisilane, 1,2,3-tri-n-heptyltrisilane, 1,2,3-tri-n-octyltrisilane, 1,2,3-tri-n-nonyltrisilane, 1,2,3-tri-n-decyltrisilane, 1,2,3-tri-n-dodecyltrisilane, 1,2,3-triphenyltrisilane, 1,2,3-tri-p-tolyltrisilane, 1,2,3-trimesithyltrisilane, 1,2,3-tribenzyltrisilane, 1,2,3-triphenethyltrisilane, 1,2,3-tris(trimethylsilylmethyl)trisilane, 1,1-diethyl-2-methyltrisilane, 1,1-dimethyl-2-n-propyltrisilane, 1,1-dimethyl-2-i-propyltrisilane, 1,1-di-n-butyl-2-methyltrisilane, 1,1-di-t-butyl-2-methyltrisilane, 1,1-di-n-hexyl-2-methyltrisilane, 1,1-dicyclohexyl-2-methyltrisilane, 1,1-di-n-heptyl-2-methyltrisilane, 1,1-dimethyl-2-n-octyltrisilane, 1,1-di-n-decyl-2-methyltrisilane, 1,1-dimethyl-2-phenyltrisilane, 1,1-di(p-methylphenethyl)-2-methyltrisilane, 1,1-dimethyl-2-(β-phenethyl)trisilane, 1,1-di-p-tolyl-2-methyltrisilane, 1,1-diphenyl-2-ethyltrisilane, 1,1-di-t-butyl-2-phenyltrisilane, 1,1-di(phenyldimethylsilyl)-2-methyltrisilane, 1,1-bis(trimethylsilyl)-2-methyltrisilane, 1,1-diethyl-3-methyltrisilane, 1,1-dimethyl-3-n-propyltrisilane, 1,1-dimethyl-3-i-propyltrisilane, 1,1-di-n-butyl-3-methyltrisilane, 1,1-di-t-butyl-3-methyltrisilane, 1,1-di-n-hexyl-3-methyltrisilane, 1,1-dicyclohexyl-3-methyltrisilane, 1,1-di-n-heptyl-3-methyltrisilane, 1,1-dimethyl-3-n-octyltrisilane, 1,1-di-n-decyl-3-methyltrisilane, 1,1-dimethyl-3-phenyltrisilane, 1,1-di-(p-methylphenethyl)-3-methyltrisilane, 1,1-dimethyl-3-(β-phenethyl)trisilane, 1,1-di-p-tolyl-3-methyltrisilane, 1,1-diphenyl-3-ethyltrisilane, 1,1-di-t-butyl-3-phenyltrisilane, 1,1-di(phenyldimethylsilyl)-3-methyltrisilane, 1,1-bis(trimethylsilyl)-3-methyltrisilane, 1,2-diethyl-3-methyltrisilane, 1,2-dimethyl-3-n-propyltrisilane, 1,2-dimethyl-3-i-propyltrisilane, 1,2-di-n-butyl-3-methyltrisilane, 1,2-di-t-butyl-3-methyltrisilane, 1,2-di-n-hexyl-3-methyltrisilane, 1,2-dicyclohexyl-3-methyltrisilane, 1,2-di-n-heptyl-3-methyltrisilane, 1,2-dimethyl-3-n-octyltrisilane, 1,2-di-n-decyl-3-methyltrisilane, 1,2-dimethyl-3-phenyltrisilane, 1,2-di(p-methylphenethyl)-3-methyltrisilane, 1,2-dimethyl-3-(β-phenethyl)trisilane, 1,2-di-p-tolyl-3-methyltrisilane, 1,2-diphenyl-3-ethyltrisilane, 1,2-di-t-butyl-3-phenyltrisilane, 1,2-di(phenyldimethylsilyl)-3-methyltrisilane and 1,2-bis(trimethylsilyl)-3-methyltrisilane.

One example of the catalyst for use in the invention comprises at least one of the metals and/or metal compounds of Groups 3B–7B and 8 of the Periodic Table, which include lanthanides such as samarium, europium and ytterbium of the Group 3B, titanium, zirconium, hafnium of the Group 4B, vanadium, niobium, tantalum of the Group 5B, chromium, molybdenum, tungsten of the Group 6B, manganese, technetium, rhenium of the Group 7B and iron, ruthenium, osmium, cobalt, rhodium, iridium, nickel, palladium, platinum of the Group 8 and their respective compounds, of which lanthanides, titanium, zirconium, hafnium, tuthenium, cobalt, rhodium, iridium, nickel, palladium and platinum are preferred.

The lanthanide compound exemplarily includes aniline acetate lanthanide, lanthanide(acetylacetonato), lanthanide halogenide, tetra(t-butyl)lithiumlanthanide, tetraphenyllanthanidelithium, methyllanthanide iodide, phenyllanthanide iodide, bis(η-cyclopentadienyl)lanthanide, chlorobis(η-cyclopentadienyl)lanthanide, dichlorobis(η-cyclopentadienyl)lanthanide, tris(η-cyclopentadienyl)lanthanide, bis(trimethylsilyl)methylbis(η-pentamethylcyclopenthadienyl)lanthanide, hydridebis(η-pentamethylcyclopentadienyl)lanthanide, methylbis(η-cyclopentadienyl)lanthanide and bis(η-cyclopentadienyl)lanthanidedi(μ-methyl)dimethylalminum.

The metal compound of Group 4B includes metal halides, metal acetylacetonatos, metal alkoxides, metal aryloxides, metal alkoxy halides, metal aryloxy halides and metal compounds containing cyclopentadienyl groups in which substituded cyclopentadienyl groups such as alkylcyclopentadienyl, indenyl or substituted indenyl are included.

The titanium compound exemplarily includes (η-cycloheptatrienyl) (η-cyclopentadienyl)titanium, titanium hydride, dicarbonylbis(η-cyclopentadienyl)titanium, bis(η-pentamethylcyclopentadienyl)titanium, titanium trichloride, chlorobis(η-cyclopentadienyl)titanium, dichloro (η-cyclopentadienyl)titanium, titanium tetrachloride, titanium tetrabromide, titanium tetraiodide, trichloromethyltitanium, methyltriisopropoxytitanium, titanium tetraethoxide, titanium tetrapropoxide, titanium tetraisopropoxide, titanium tetrabutoxide, dihydridebis(η-pentamethylcyclopentadiethyl)titanium, trichloro(η-cyclopentadienyl)titanium, dichlorobis(η-cyclopentadienyl)titanium, dichlorobis(η-methylcyclopentadienyl)titanium, dichlorobis(η-dimethylcyclopentadienyl)titanium, dichlorobis(η-trimethylcyclopentadienyl)titanium, dichlorobis(η-pentamethylcyclopentadienyl)titanium, dichlorobis(η-trifluoromethylcyclopentadienyl)titanium, dichlorobis(η-trimethylsilylcyclopentadienyl)titanium, dichloro(η-pentamethylcyclopentadienyl)(η-cyclopentadienyl)titanium, dichloro(η-trifluoromethylcyclopentadienyl)(η-cyclopentadienyl)titanium, dichloromethylenebis(η-cyclopentadienyl)titanium, dichloroethylenebis(η-cyclopentadienyl)titanium, dichloropropylenebis(η-cyclopentadienyl)titanium, dichlorodimethylsilylenebis(η-cyclopentadienyl)titanium, dichlorobis(η-indenyl)titanium, dichlorobis(η-methylindenyl)titanium, dichlorobis(η-dimethylindenyl)titanium, dichlorobis(η-trimethylsilylindeyl)titanium, dichloromethylenebis(η-indenyl)titanium, dichloroethylenebis(η-indenyl)titanium, dichloropropylenebis(η-indenyl)titanium, dimethylbis(η-cyclopentadienyl)titanium, dimethylbis (η-methylcyclopentadienyl)titanium, dimethylbis (η-pentamethylcyclopentadienyl)titanium, dimethylbis (η-trimethylsilylcyclopentadienyl)titanium, dimethylbis (η-indenyl)titanium, diphenylbis (η-cyclopentadienyl)titanium, diphenylbis (η-methylcyclopentadienyl)titanium, dibenzylbis (η-cyclopentadienyl)titanium, bis (trimethylsilylmethyl)bis(η-cyclopentadienyl)titanium, dimethoxybis(η-cyclopentadienyl)titanium, diethoxybis(η-cyclopentadienyl)titanium, dibutoxybis(η-cyclopentadienyl)titanium and diphenoxybis(η-cyclopentadienyl)titanium.

The zirconium compound exemplarily includes bis(η-cyclooctatetraene)zirconium, zirconium hydroxide, bis(η-cyclopentadienyl)(η-1,3-butadiene)zirconium, dicarbonylbis(η-cyclopentadienyl)zirconium, chlorobis(η-cyclopentadienyl)zirconium, benzylbis(η-cyclopentadienyl)zirconium, trimethylsilylmethylbis(η-cyclopentadienyl)zirconium, zirconium tetrachloride, zirconium acetylacetonato, zirconiumtetraethoxide, zirconiumtetrabutoxide, tetraallyzirconium, trichloro(η-pentamethylcyclopentadienyl)zirconium, tribromo(η-cyclopentadienyl)zirconium, bis(η-cyclopentadienyl) dihydride zirconium, chlorobis(η-cyclopentadienyl)hydride zirconium, bis(tetrahydroborate)bis(η-cyclopentadienyl) zirconium, dichlorobis(η-cyclopentadienyl)zirconium, dichlorobis(η-methylcyclopentadienyl)zirconium, dichlorobis(η-dimethylcyclopentadienyl)zirconium, dichlorobis(η-trimethylcyclopentadienyl)zirconium, dichlorobis(η-pentamethylcyclopentadienyl)zirconium, dichlorobis(η-trifluoromethylcyclopentadienyl)zirconium, dichlorobis(η-trimethylsilylcyclopentadienyl)zirconium, dichloro(η-pentamethylcyclopentadienyl)(η-cyclopentadienyl)zirconium, dichloro(η-trifluromethylcyclopentadienyl)(η-cyclopentadienyl) zirconium, dichloromethylenebis(η-cyclopentadienyl) zirconium, dichloroethylenebis(η-cyclopentadienyl) zirconium, dichloropropylenebis(η-cyclopentadienyl) zirconium, dichlorodimethylsilylenebis(η-cyclopentadienyl)zirconium, dichlorobis(η-indenyl) zirconium, dichlorobis(η-methylindenyl)zirconium, dichlorobis(η-dimethylindenyl)zirconium, dichlorobis(η-trimethylsilylindenyl)zirconium, dichloromethylenebis(η-indenyl)zirconium, dichloroethylenebis(η-indenyl) zirconium, dichloropropylenebis(η-indenyl)zirconium, dimethylbis(η-cyclopentadienyl)zirconium, dimethylbis(η-pentamethylcyclopentadienyl)zirconium, dimethylbis(η-indenyl)zirconium, diphenylbis(η-cyclopentadienyl) zirconium, diphenylbis(η-methylcyclopentadienyl) zirconium, dibenzylbis(η-cyclopentadienyl)zirconium, bis (trimethylsilylmethyl)bis(η-cyclopentadienyl)zirconium, dimethoxybis(η-cyclopentadienyl)zirconium, diethoxybis (η-cyclopentadienyl)zirconium, dibutoxybis(η-cyclopentadienyl)zirconium and diphenoxybis(η-cyclopentadienyl)zirconium.

The hafnium compound exemplarily includes bis(η-butadiene)[1,2-bis(dimethylphosphino)ethane]hafnium, dicarbonylbis(η-cyclopentadienyl)hafnium, trimethylsilylmethylbis(η-isopropylcyclopentadienyl) hafnium, tetrabenzylhafnium, trichloro(η-cyclopentadienyl) hafnium, chlorobis(η-cyclopentadienyl)hydride hafnium, dihydridobis(η-cyclopentadienyl)hafnium, bis (tetrahydroborate)bis(η-methylcyclopentadienyl)hafnium, dichlorobis(η-cyclopentadienyl)hafnium, dichlorobis(η-methylcyclopentadienyl)hafnium, dichlorobis(η-dimethylcyclopentadienyl)hafnium, dichlorobis(η-trimethylcyclopentadienyl)hafnium, dichloro(η-pentamethylcyclopentadienyl)(η-cyclopentadienyl) hafnium, dichloro(η-trifluoromethylcyclopentadienyl)(η-cyclopentadienyl)hafnium, dichlomethylenebis(η-cyclopentadienyl)hafnium, dichloroethylenebis(η-cyclopentadienyl)hafnium, dichlopropylenebis(η-cyclopentadienyl)hafnium, dichlorodimethylsilylenebis(η-cyclopentadienyl)hafnium, dichlorobis(η-indenyl)hafnium, dichlorobis(η-methylindenyl)hafnium, dichlorobis(η-dimethylindenyl)hafnium, dichlorobis(η-trimethylindenyl) hafnium, dichloromethylenebis(η-indenyl)hafnium, dichloroethylenebis(η-indenyl)hafnium, dichloropropylenebis(η-indenyl)hafnium, dimethylbis (η-cyclopentadienyl)hafnium, dimethylbis (η-pentamethylcyclopentadienyl)hafnium, dimethylbis (η-indenyl)hafnium, diphenylbis (η-cyclopentadienyl) hafnium, dipehnylbis (μ-methylcyclopentadienyl)hafnium, dibenzylbis(η-cyclopentadienyl)hafnium, bis (trimethylsilylmethyl)bis(η-cyclopentadienyl)hafnium, dimethoxybis(η-cyclopentadienyl)hafnium, diethoxybis(η-cyclopentadienyl)hafnium, dibutoxybis(η-cyclopentadienyl)hafnium, and diphenoxybis(η-cyclopentadienyl)hafnium.

The cobalt compound exemplarily includes hexacarbonylbis(tributylphosphine)dicobalt, hexacarbonyl-μ-(diphenylacetylene)dicobalt, tetracarbonylbis(μ-butadiene)dicobalt, dodecacarbonyltetracobalt, hydridotetracarbonylcobalt, tetracarbonyl(trimethylsilyl) cobalt, (η-allyl)tricarbonylcobalt, hydrido(dinitrogen)tris (triphenylphosphine)cobalt, tetrakis(trimethylphosphine) methylcobalt, dicarbonyl(η-cyclopnetadienyl)cobalt, bis[(μ-carbonyl)(η-cyclopentadienyl)cobalt], tris[(μ-carbonyl)(η- cyclopentadienyl)cobalt], dicarbonyl(η-pentamethylcyclopentadienyl)cobalt, bis(trimethylphosphido)(η-cyclopnetadienyl)cobalt, chlorotris(triphenylphosphine)cobalt, (η-cyclopentadienyl)bis(triphenylphosphine)cobalt, (η-cyclopentadienyl)bis(η-ethylene)cobalt, (η-cyclopentadienyl)(η-1,5-cyclooctadiene)cobalt, (η-cyclopentadienyl)(η-cyclohexadiene)cobalt, cobalt acetate, cobalt (acetylacetonato), cobalt chloride, cobalt bromide, cobalt iodide, cobalt thiocyanate, bis(η-cyclopentadienyl)cobalt, carbonyl(η-cyclopentadienyl)diiodocobalt, (η-cyclopentadienyl)(triphenylphosphine)diiodocobalt, bis(η-cyclopentadienyl)cobalt tribromide, (η-cyclopnetadienyl)(η-cyclohexadienyl)cobalt iodide and (η-benzene)(η-cyclopentadienyl)cobalt tetrafluoroborate.

The nickel compound exemplarily includes tetracarbonylnickel, dicarbonylbis(triphenylphosphine)nickel, bis(1,5-cyclooctadiene)nickel, (η-ethylene)bis(triphenylphosphine)nickel, tetrakis(triphenylphosphine)nickel, tetrakis(t-butyl isocyanide)nickel, µ-(dinitrogen)bis[bis(tricyclohexylphosphine)nickel], nickelacetate, nickel (acetylacetonato), nickel chloride, nickel bromide, dichloro[1,2-bis(diphenylphosphino)ethane]nickel, trans-bis(1,3-butadiynyl)bis(tributylphosphine)nickel, dimethylbis(trimethylphosphine)nickel, diethyl(2,2'-bipyridyl)nickel, trans-bromo(phenyl)bis(triethylphosphine)nickel, tetramethylenebis(triphenylphosphine)nickel, trans-chloro(hydride)bis(tricyclohexylphosphine)nickel, bis(η-cyclopentadienyl)nickel, chloro(η-cyclopentadienyl)(triphenylphosphine)nickel, methyl(η-cyclopentadienyl)(triphenylphosphine)nickel, (η-allyl)(η-cyclopentadienyl)nickel, (η-1,5-cyclooctadiene)(η-cyclopentadienyl)nickeltetrafluoro borate, bis(η-allyl)nickel, (η-allyl)bromo(triphenylphosphine)nickel, and bis(η-cyclopentadienyl)di(µ-carbonyl)dinickel.

The ruthenium compound exemplarily includes ruthenium carbon, ruthenium alumina, dodecacarbonyltriruthenium, tetra-µ-hydridedodecacarbonyltetraruthenium, tetracarbonyl(trimethylphosphido)ruthenium, pentakis(trimethylphosphido)ruthenium, tricarbonyl(cyclooctatetraene)ruthenium, tricarbonyl(1,5-cyclooctadiene)ruthenium, tetracarbonylbis(η-cyclopentadienyl)diruthenium, tetracarbonylbis(η-pentamethylcyclopnetadienyl)diruthenium, dicarbonyltris(triphenylphosphine)ruthenium, diacetatodicarbonylbis(triphenylphosphine)ruthenium, di-µ-chlorobis(chlorotricarbonylruthenium), dichlorotris(triphenylphosphine)ruthenium, carbonylchlorohydridotris(triphenylphosphine)ruthenium, dihydridotetrakis(triphenylphosphine)ruthenium, trans-dichlorotetrakis(t-butylisocyanide)ruthenium, bis(η-cyclopentadienyl)ruthenium, chloro(η-cyclopentadienyl)bis(triphenylphosphine)ruthenium, hydrido(η-cyclopentadienyl)bis(triphenylphosphine)ruthenium, cyclopentadienyltris(trimethylphosphine)rutheniumhexafluorophosphate, chlorodicarbonyl(η-cyclopentadienyl)ruthenium, hydrido(cyclopentadienyl)(1,5-cyclooctadiene)ruthenium, chloro(cyclopentadienyl)(1,5-cyclooctadiene)ruthenium, tricarbonyl(pentamethylcyclopentadienyl)ruthenium-tetrafluoroborate, ruthenium(acetylacetonate), ruthenium chloride, dichloro(pentamethylcyclopentadienyl)ruthenium, dichloro(pentamethylcyclopentadienyl)(triphenylphosphine)ruthenium, tetrahydridotris(triphenylphosphine)ruthenium, trichloro(pentamethylcyclopentadienyl)ruthenium, trihydro(pentamethylcyclopentadienyl)(triphenylphosphine)ruthenium, and dichloro(η-allyl)(cyclopentadienyl)ruthenium- The rhodium compound exemplarily includes rhodium carbon, rhodium alumina, rhodium silica, octacarbonyldirhodium, dodecacarbonyltetrarhodium, rhodium(dicarbonyl)(acetylacetonato), di-µ-chlorotetracarbonyldirhodium, hydridotetracarbonylrhodium, chlorotris(triphenylphosphine)rhodium, tetrakis(trimehtylphosphine)rhodium chloride, trans-[chlorocarbonylbis(tricyclohexylphosphine)rhodium], hydridotris(triisopropylphosphine)rhodium, hydridotetrakis(triphenylphosphine)rhodium, hydridotetrakis(triisopropylphosphido)dirhodium, di-µ-chloro-tetra(η-ethylene)dirhodium, di-µ-chlorotetrakis(cyclooctene)dirhodium, di-µ-chlorobis(cyclooctadiene)dirhodium, di-µ-chloro-bis(η-tetraphenylcyclobutadiene)dirhodium, 2,4-pentandionatobis(ethylene)rhodium, bis(cycloocta-1,5-diene)rhodium, 1,5-cyclooctadienebis(acetonitrile)rhodiumtetrafluoro borate, diammine cyclooctadienerhodiumhexafluorophosphate, rhodium acetate, rhodium(acetylacetonate), rhodium chloride, rhodium bromide, di-µ-chlorodichlorobis(pentamethylcyclopentadienyl)dirhodium, di-µ-carbonyl-bis(pentamethylcyclopentadienyl)dirhodium, tris(acetonitrile)pentamethlcycclopentadienylrhodiumdihexafluorophosphate, (1,4-butandiel)(η-pentamethylcyclopentadienyl)(triphenylphosphine)rhodium, di-µ-chloro-tetralkis(η-allyl)dirhodium, tris(η-allyl)rhodium, hydridooctaethylporphyrinatorhodium, dimethyl-di-µ-methylenebis(pentamethylecyclopentadienyl)dirhodium and dihydridobis(triethylsilyl)pentamethylcyclopentadienylrhodium.

The palladium compound exemplarily includes palladium carbon, palladium alumina, tetrakis(triphenylphosphine)palladium, bis(tricyclohexylphosphine)palladium, tetrakis(triethylphosphido)palladium, carbonyltris(triphenylphosphine)palladium, (η-ethylene)bis(triphenylphosphine)palladium, bis(cycloocta-1,5-diene)palladium, tris(dibenzylideneacetone)dipalladium, dichloro-µ-bis[bis(diphenylphosphino)methane]dipaladium, palladium acetate, palladium(acetylacetonato), palladium chloride, palladium iodide, dichlorobis(benzonitrile)palladium, dichloro(1,5-cyclooctadiene)palladium, dichlorobis(triphenylphosphine)palladium, di-µ-chlorodichlorobis(isocyanido)dipalladium, di-µ-chloro-dichlobis(tripehnylphosphine)dipalladium, trans-[bis(t-butylisocyanide)dichloropalladium], chloromethyl(1,5-cyclooctadiene)palladium, dimethylbis(triethylphosphine)palladium, trans-[bromo(methyl)bis(triethylphosphine)palladium], trans-chloro(phenylethynyl)bis(tributylphosphine)palladium, cyclopentadienyl(phenyl)(triethylphosphine)palladium, η-allyl(pentamethylcyclopentadienyl)palladium, η-allyl(1,5-cyclooctadiene)palladiumtetrafluoroborate and di-µ-chlorobis(η-allyl)dipalladium.

The iridium compound exemplarily includes dodecacarbonyltetrairidium, hexacarbonylhexairidium, di-µ-chlorotetrakis(cyclooctene)diiridium, di-µ-chlorotetrakis(ethylene)diiridium, di-µ-chlorobis(1,5-cyclooctadiene)diiridium, chlorotris(triphenylphosphine)iridium, chlorocarbonylbis(triphenylphosphine)iridium, chloroethylenebis(triphenylphoephine)iridium, chloro(dinitrogen)bis(tripenylphosphine)iridium, (pentamethylcyclopentadienyl)dicarbonyliridium, pentamethylcyclopentadienylbis(ethylene)iridium, carbonylhydridetris(triphenylphosphine)iridium, chlorodicarbonyl(p-toluidine)iridium, carbonylmethylbis(triphenylphosphine)iridium, iridium(acetylacetonato), iridium chloride, tris(η-allyl)iridium, di-μ-chlorodichlorobis (pentamethylcyclopentadienyl)diiridium, trichlorotris (triethylphosphine)iridium, dihydrido(pentamethylcyclopentadienyl)trimethylphosphineiridium and pentahydridebis(trimethylphosphine)iridium.

The platinum compound exemplarily includes platinum carbon, platinum alumina, bis(dibenzilidene acetone) platinum, tris(ethylene)platinum, tetrakis (triphenylphosphine)platinum, tris(triphenylphosphine) platinum, tetrakis(triphenylphosphido)platinum, carbonyltris(tripehnylphosphine)platinum, bis (triphenylphosphine)(diphenylacetylene)platinum, bis (triphenylphosphine)(trans-stilbene)platinum, bis[carbonyl (pentamethylcyclopentadienyl)platinum], μ-[bis-(diphenylphosphino)methane]-bis(chloroplatinum), platinum(acetylacetonato), platinum dichloride, platinum dibromide, cis-bis(benzonityl)dichloroplatinum, cis-dichlorobis(acetonitryl)platinum, trans-dichlorobis (acetonitryl)platinum, dichloro(η-1,5-cyclooctadiene) platinum, cis-dichlorobis(tributylphosphine)platinum, trans-dichlorobis(tributylphosphine)platinum, cis-[dichloro (phenylisocyanide)(triphenylphosphine)platinum], cis-[dichloro(diaminocarbene)(triethylphosphine)platinum], trichloro(η-ethylene)potassium platinate, di-μ-chloro-dichloro(ethylene)diplatinum, bis(1,5-cyclooctadiene) platinum, trans-hydridechlorobis(triethylphosphine) platinum, dimethyl(1,5-cyclooctadiene)platinum, trans-[iodo(methyl)bis(triethylphosphine)platinum], cis-[chloro (methyl)bis(dimethylphenylphosphine)platinum]dibutylbis (triphenylphosphine)platinum and platinum tetrachloride.

The above exemplified metals or compounds thereof may be used in combination.

An alternative catalyst used in the invention comprises a mixture of the above recited metals or their compounds and a silyl compound (IV) having the formula $R^{18}R^{19}R^{20}SiA$ wherein $R^{18}$, $R^{19}$ and $R^{20}$ each are selected from the group consisting of $C_1$-$C_{12}$ alkyl, $C_7$-$C_{12}$ aralkyl, $C_6$-$C_{12}$ aryl and silyl groups of the formula (T), and A is Li, Na or K. The catalyst and formula (IV) silyl compound may be combined in a catalyst:formula (IV) silyl compound ratio of 1:0.01 to 1:100 to form the mixture. Specific examples of such silyl compound include phenyldimethylsilyllithium, diphenylmethylsilyllithium, t-butyldiphenylsilyllithium, triphenylsilyllithium, tris(trimethylsilyl)silyllithium, trimethylsilylsodium, triethylsilylsodium, tri-n-propylsilylsodium, tri-i-propylsilylsodium, tri-n-butylsilylsodium, tri-n-hexylsilylsodium, triphenylsilylsodium, ethyldimethylsilylsodium, n-propyldimethylsilylsodium, i-propyldimethylsilylsodium, n-butyldimethylsilylsodium, t-butyldimethylsilylsodium, n-hexyldimethlsilylsodium, cyclohexyldimethylsilylsodium, n-octyldimethylsilylsodium, n-decyldimethylsilylsodium, phenyldimethylsilylsodium, benzyldimethylsilylsodium, phenethyldimethylsilylsodium, di-n-butylmethlsilylsodium, diphenylmethylsilylsodium, t-butyldiphenylsilylsodium, tris(trimethylsilyl)silisodium, trimethylsilylpotassium, triethylsilylpotassium, tri-n-propylsilylpotassium, tri-i-propylsilylpotassium, tri-n-butylsilylpotassium, tri-n-hexylsilylpotassium, triphenylsilylpotassium, ethyldimethylsilylpotassium, n-propyldimethylsilylpotassium, i-propyldimethylsilylpotassium, n-butyldimethylsilylpotassium, t-butyldimethylsilylpotassium, n-hexyldimethylsilylpotassium, cyclohexyldimethylsilylpotassium, n-octyldimethylsilylpotassium, n-decyldimethylsilylpotassium, phenyldimethylsilylpotassium, benzyldimethylsilylpotassium, phenethyldimethylsilylpotassium, di-n-butylmethylsilylpotassium, diphenylmethylsilylpotassium, t-butyldiphenylsilylpotassium and tris(trimethylsilyl) silylpotassium. Two or more of these compounds may be used in combination. These silyl compounds may contain a liquid such as ether or tetrahydrofuran.

Another alternative catalyst according to the invention comprises a mixture of the above metal or metal compound and a metal hydride (V). Preferred metal hydrides of the invention, which include metal deuterides and metals having simultaneously both hydride and deuteride ligands, are selected from the group consisting of LiX, NaX, KX, $CaX_2$, $AlX_3$, $R^{21}{}_{(3-p)}AlX_p$, $LiAlX_4$, $LiAlR^{22}{}_{(4-q)}X_q$, $NaAlR^{22}{}_{(4-9)}X_9$, $BX_3$ and complexes thereof, $B_2X_6$, $BR^{21}{}_{(3-p)}X_p$, $LiBX_4$, $LiBR^{22}{}_{(4-q)}X_q$, Li(9-BBN)X, $NaBX_4$, $KBX_4$ and $(R^{21})_4N$—$BX_4$, wherein X is independently hydrogen or deuterium at each occurrence, $R^{21}$ is independently $C_1$-$C_5$ alkyl at each occurrence, p is 1 or 2, $R^{22}$ is independently $C_1$-$C_8$ alkyl or $C_1$-$C_8$ alkoxy where either the alkyl or alkoxy group contains 0–2 oxygen atoms present as an ether group at each occurrence, and q is 1, 2 or 3. The catalyst and formula (V) metal hydride and deuteride may be combined in a catalyst to formula (V) metal hydride or deuteride molar ratio of 1:0.01 to 1:100, preferably in a molar ratio of 1:0.1 to 1:50.

Exemplary metal hydrides (V) according to the invention include, without limitation, LiH, NaH, KH, $CaH_2$, $AlH_3$, $MeAlH_2$, $EtAlH_2$, n-$PrAlH_2$, i-$PrAlH_2$, n-$BuAlH_2$, i-$BuAlH_2$, sec-$BuAlH_2$, t-$BuAlH_2$, $Me_2AlH$, $Et_2AlH$, n-$Pr_2AlH$, i-$Pr_2AlH$, n-$Bu_2AlH$, i-$Bu_2AlH$, sec-$Bu_2AlH$, t-$Bu_2AlH$, $LiAlH_4$, $LiAi(Et)_2H_2$, $LiAl(n-Pr)_2H_2$, $LiAl(i-Pr)_2H_2$, $LiAl(n-Bu)_2H_2$, $LiAl(i-Bu)_2H_2$, $LiAl(sec-Bu)_2H_2$, $LiAl(t-Bu)_2H_2$, $LiAl(Et)_3H$, $LiAl(n-Pr)_3H$, $LiAl(i-Pr)_3H$, $LiAl(n-Bu)_3H$, $LiAl(i-Bu)_3H$, $LiAl(sec-Bu)_3H$, $LiAl(OMe)_3H$, $LiAl(OEt)_3H$, $LiAl(O-t-Bu)_3H$, $NaAl(OCH_2CH_2-OMe)_3H$, $BH_3$, $BH_3$—$NH_3$ complex, $BH_3$-t-butylamine complex, $B_2H_6$, $[(CH_3)_2CHCH(CH_3)]_2BH$, $LiBH_4$, $LiB(sec-Bu)_3H$, $LiB(Et)_3H$, Li(9-BBN)H, $NaBH_4$, $KBH_4$, $Me_4NBH_4$, $Et_4NBH_4$, LiD, NaD, KD, $CaD_4$, $AlD_3$, $MeAlD_2$, $EtAlD_2$, n-$PrAlD_2$, i-$PrAlD_2$, n-$BuAlD_2$, i-$BuAlD_2$, sec-$BuAlD_2$, t-$BuAlD_2$, $Me_2AlD$, $Et_2AlD$, n-$Pr_2AlD$, i-$Pr_2AlD$, n-$Bu_2AlD$, i-$Bu_2AlD$, sec-$Bu_2AlD$, t-$Bu_2AlD$, $LiAlD_4$, $LiAl(Et)_2D_2$, $LiAl(n-Pr)_2D_2$, $LiAl(i-Pr)_2D_2$, $LiAl(n-Bu)_2D_2$, $LiAl(i-Bu)_2D_2$, $LiAl(sec-Bu)_2D_2$, $LiAl(t-Bu)_2D_2$, $LiAl(Et)_3D$, $LiAl(n-Pr)_3D$, $LiAl(i-Pr)_3D$, $LiAl(n-Bu)_3D$, $LiAl(i-Bu)_3D$, $LiAl(sec-Bu)_3D$, $LiAl(OMe)_3D$, $LiAl(OEt)_3D$, $LiAl(O-t-Bu)_3D$, $NaAl(OCH_2CH_2-OMe)_3D$, $BD_3$, $BD_3$-$NH_3$ complex, $BD_3$-t-butylamine complex, $B_2D_6$, $[(CH_3)_2CHCH (CH_3)]_2BD$, $LiBD_4$, $LiB(sec-Bu)_3D$, $LiB(Et)_3D$, Li(9-BBN)D, $NaBD_4$, $KBD_4$, $Me_4NBD_4$ and $Et_4NBD_4$.

The metal hydrides (V) according to the invention may be used alone or in combination.

For every 100 moles of hydrosilane monomer (I, II and/or III), there is preferably present about 0.01–10 moles, and more preferably about 0.1–5 moles, of the catalyst comprising at least one metal or metal compound of Groups 3B–7B and 8, preferably Groups 3B, 4B and 8 of the Periodic Table, as specified herein. When present, the silyl compound (IV) or the metal hydride (V), also as specified herein, is used in an amount of about 0.005 to 50 moles, preferably 0.05 to 20 moles, per 100 moles of hydrosilane monomer.

The catalysts used in the invention may be added with crown ethers such as 12-crown-4, 15-crown-5, 18-crown-6, dibenzo-12-crown-4, dibenzo-15-crown-5 and dibenzo-18-crown-6, or diamines such as tetramethylethylenediamine. These additives may be used in an amount of usually about 0.005 to 50 moles, preferably about 0.05 to 20 moles per 100 moles of hydrosilane monomer (I, II and/or III).

The dehydrogenative condensation reaction for the hydrosilane monomers should be carried out at a temperature of usually 0° C. to 400° C., preferably 0° C. to 250° C., more preferably 25° C. to 210° C., under a pressure of usually 1 mmHg to 200 kg/cm², preferably atmospheric to 100 kg/cm² and for a time period of usually 5 minutes to 72 hours, preferably 5 minutes to 24 hours, more preferably 30 minutes to 3 hours, depending upon the reaction temperature, the amount of the catalyst and the amount of the starting monomer used.

The reaction may be effected with or without the use of solvents. These solvents, when desired, may be chosen from the group of hydrocarbon solvents such as toluene, xylene, heptane, decane and dodecane, ether solevents such as diethylether, isoproply ether, methylbuthyl ether, dimethoxy-ethane, tetrahydrofuran and dioxane, amide solvents such as dimethylformamide and hexamethylphosphoric triamide, ester solvents such as ethylacetate and butylacetate, and sulfoxides such as dimethylsulfoxide.

The order in which the catalyst and the monomer are added is optional; they made be added together or added one after the other.

The reaction according to the invention is conducted preferably in the presence of an inert gas such as argon and nitrogen regardless of the use of solvents.

The resultant condensate may be treated with acids such as hydrochloric acid, sulfuric acid, acetic acid, trifluoro acetate and benzenesulfonic acid, or alternatively refined with use of Florisil (tradename) or by re-precipitation. These processes may also be combined. The condensate may be determined as to its structure by means of infrared or ultraviolet absorption spectrum, nuclear magnetic resonance (such as $^1$HNMR, $^{13}$CNMR and $^{29}$SiNMR) and gel permeation chromatography.

The condensate obtained in accordance with the invention usually contains repeating units of the formulae

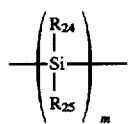

(i)

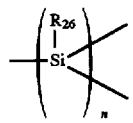

(ii)

and

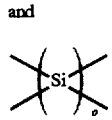

(iii)

wherein $R^{24}$, $R^{25}$ and $R^{26}$ are identical or different, and each include hydrogen $C_1$–$C_{12}$ alkyl, cycloslkyl and halogenated alky groups, $C_7$–$C_{12}$ aralkyl and halogenated aralykl groups, $C_6$–$C_{12}$ aryl groups and the silyl groups (formula I'), and may be crosslinked within and between the repeating unit structures. $R_{24}$, $R_{25}$ and $R_{26}$ are preferably sec-alkyl or tert-alkyl groups, more preferably tert-alkyl groups. The value for n/m is usually 0–10, preferably 0–5, and o/n is usually 0–10, preferably 0–5.

The repeating units (i), (ii) and (iii) vary in structure with the reaction temperature. They are predominantly straight-chain or monocyclic at a relatively low reaction temperature (usually 0°–60° C.), leading to less branched or crosslinked polysilanes which have a polymerization degree of usually 20–100 and a weight average molecular weight (Mw) of usually 100–10,000,000, preferably 500–1,000,000 and a number average molecular weight (Mn) of usually 100–1,000,000, preferably 300–500,000. n/m is usually 0–10, preferably 0–5, and o/n is usually 0–10, preferably 0–5.

The values n and/or o in the above formulae tend to be greater the higher the reaction temperature giving less straight-chain or monocyclic structure usually at 180°–250° C. and thus leading to the yield of polysilanes rich in branched crosslinked or polycyclic structure which have a polymerization degree of usually 6–2,000, a weight average molecular weight (Mw) of usually 100–10,000,000, preferably 500–1,000,000 and a number average molecular weight (Mn) of usually 100–1,000,000, preferably 300–500,000. In this instance the values M, n and o may possibly be 0 and the ranges of n/m and o/n, therefore not exactly predictable, may each be usually 0–1,000, preferably 0–100.

At an intermediate reaction temperature of 60°–180° C., there will be obtained a polysilane having a polymerization degree of usually 10–1,000, a weight average molecular weight (Mw) of usually 100–10,000,000, preferably 500–1,000,000 and a number average molecular weight (Mn) of usually 100–1,000,000, preferably 300–500,000, in which instance the values n/m and o/n each are usually 0–100, preferably 0–20.

The ratios of m, n and o may be adjusted according to the type of the starting hydrosilane feedstock used and the relative amounts of two or more different hydrosilanes that may be used. The condensate of the invention is preferably composed of the repeating units (ii) and (iii), more preferably composed predominantly of the repeating unit (iii).

The condensate product is subjected to thermal decomposition in which it is dissolved in a suitable solvent such as toluene and/or tetrahydrofuran and cast over a sheet of quartz, stainless steel or a silicon wafer. Alternatively, the condensate may be thermally decomposed after it is processed into a fibrous or pellet form. The thermal decomposition is effected in the presence of an inert gas such as argon and/or nitrogen, in the presence of a reducing gas such as hydrogen or in a vacuum of $10^{-5}$–$10^4$ pa, preferably $10^{-3}$–$10^3$ pa and at a temperature of 100°–2,000° C., preferably 200°–1,000° C. The thermal decomposition may be effected further in the presence of a vapor such as of iodine, ferric chloride, antimony pentafluoride, antimony pentachloride, arsenic pentafluoride, phosphorous trichloride, borone tribromide and aluminum trichloride.

The semiconducting material derived from the inventive process ranges in hue from yellow to dark brown, to glossy silver and has in the case of a film a thickness of usually 0.01 μm–500 μm, preferably 0.1 μm–50 μm, and an optical band-gap (Eo) of usually 0.1–4.0 eV, preferably 0.5–2.0 eV.

The semiconducting material according to the invention contains silicon in an amount of more than 55 atomic %, preferably more than 60 atomic %, more preferably more than 70 atomic %, and most preferably more than 80 atomic %. It should be noted that according to the inventive method it is possible to make a semiconducting material without any companion component such as carbon.

EXAMPLES

The invention will now be illustrated in more detail by the following non-limiting examples, which demonstrate the advantageous properties of the present invention. Parts and percentages are by weight unless indicated otherwise.

The analyses of the thermally decomposed products in the following examples were conducted according to the Electron Spectroscopy for Chemical Analysis technique using an ESCA-850 made by Shimazu Seisakusho Ltd., Japan (x-ray source: MgKα, 10kV, 30 mA; Ar$^+$ sputtering).

EXAMPLE 1

166 mg (0.437 mmol) of $Cp_2HfCl_2$ and 369 mg (0.784 mmol) of $(Me^3Si)^3SiLi$-$THF^3$ were placed into a 100 ml glass flask equipped with magnetic stirrer, followed by addition of 5.0 ml (40 mmol) of $PhSl_3$. Immediately thereafter, there was vigorous gas formation, whereupon the reaction product discolored to yellowish brown. The gas generation continued vigorously for about 10 minutes and then grew mild. The admixture was stirred first at 100° C. for one hour and then at 200° C. for two hours, whereupon the reaction product was dissolved in 500 ml toluene, passed through a column containing 55 g of Florisil and stripped of toluene to give a yellowish particulate condensate in a yield of 96% by weight in terms of $PhSiH_3$.

The condensate was dissolved in toluene, cast over a sheet of quartz glass and heated at 700° C. for one hour in an argon atmosphere. There was obtained a thin dark brown film which exhibited a conducting of $10^{-3}$ s/cm.

EXAMPLE 2

64 mg (0.17 mmol) of $Cp_2HfCil_2$, 30 mg (0.76 mmol) of KH and 249 mg (0.942 mmol) of 18-crown-6 were put together with 2.5 g (17 mmol) of n-$HexH_2SiSiH_3$ and heated at 100° C. for one hour and then at 150° C. for two hours. The reaction product was refined in a manner similar to Example 1, whereupon there was obtained a reddish brown solid polysilane in a yield of 75% by weight in terms of n-$HexH_2SiSiH_3$.

The resulting condensate was dissolved in toluene, cast over a sheet of quartz glass and heated at 500° C. for two hours in an argon atmosphere thereby forming a thin dark brown film which exhibited a conductivity of $10^{-5}$ s/cm.

EXAMPLE 3

A 1-liter autoclave equipped with a stirrer was charged with 290.7 mg (0.9945 mol) of dichloro-bis-cyclopentadienyl zirconium, 868.95 mg (1.845 mmol) of tris-(trimethylsilyl)-silyllithium-3-tetrahydrofuranate, 11.03 g (110.0 mmol) of cyclopentylsilane, 2.40 g (74.8 mmol) of silane gas and 141 ml of toluene. The admixture was stirred at 200° C. for 5 hours, followed by addition of 30 ml of toluene and 10 ml of trifluoroacetate and then agitation at 80° C. for one hour. The reaction mixture was allowed to precipitate in 500 ml of methanol, with the resulting precipitate filtered, washed with methanol and vacuum-dried to give 9.64 g of a yellowish powdery polymer (75% yield in terms of polystyrene; Mw=2,600, Mw/Mn=1.7).

The polymer was dissolved in xylene to make a 10% by weight solution and spin-coated on a 5×5 cm quartz substrate, followed by calcination at 600° C. for 3 hours in the presence of a flow of argon at 2 l/min. There was obtained a dark brown thin film measuring 0.2 µm thick (by contact stylus method) which had a conductivity of $10^{-5}$ s/cm and an optical band-gap (Eo) of 1.6 eV. ESCA: 81.2 atomic % Si and 18.8 atomic % C.

EXAMPLE 4

The procedure of Example 3 was followed except that 199.0 mg (0.7991 mol) of dichloro-bis-cyclopentadienyltitanium, 875.6 mg (1.859 mmol) of tris-(trimethylsilyl)silyllithium-3-tetrahydrofuranate, 9.36 g (80.5 mmol) of n-hexylsilane and 2.40 g (74.8 mmol) of silane gas were used. There was obtained a milky white powdery polymer (8.23 g, yield 70%, Mw-15,000, Mw/Mn=3.2 in terms of polystyrene).

The polymer was dissolved in xylene to make a 10 wt. % solution which was then applied to a quartz substrate and calcined in a manner similar to Example 3. The resulting film was brown and 0.1 µm thick. Its conductivity was $10^{-6}$ s/cm and its optical band-gap (Eo) was 1.8 eV. ESCA: 75.3 atomic % Si and 24.7 atomic % C.

EXAMPLE 5

The procedure of Example 3 was followed except that the starting monomer comprised 4.0 g (34 mmol) of n-hexylsilane and 1.1 g (35 mmol) of monosilane gas, and the catalyst comprised 196 mg (0.342 mmol) of bis (trimethylsilyl)-methyl-bis-(η-pentamethylcyclopentadienyl)-neodymium and that the admixture was reacted at 200° C. for 24 hours. There was obtained a brown powdery polysilane (3.5 g, yield 69%, Mw=9,800, Mw/Mn=4.4 in terms of polystyrene).

Upon calcination, the brown powdery polysilane turned into a brown thin film whose conductivity was $10^{-6}$ s/cm and optical band-gap (Eo) was 2.2 eV. ESCA: 60.2 atomic % Si and 39.8 atomic % C.

EXAMPLE 6

The procedure of Example 3 was followed except that the catalyst comprised 666 mg (0.695 mmol) of dichloro-tris-(triphenylphosphine)ruthenium and 94.4 mg (2.35 mmol) of potassium hydride. The resulting brown powdery polysilane (3.3 g, yield 65%) was calcined to produce a dark brown film having a conducting of $10^{-6}$ s/cm and an optical band-gap (Eo) of 1.5 eV. ESCA: 90.7 atomic % Si and 9.3 atomic % C.

EXAMPLE 7

The procedure of Example 1 was followed except that the starting monomer was benzylsilane (4.89 g, 40 mmol) and the catalyst comprised dichloro-bis-(triphenylphosphine)-cobalt (440 mg, 0.673 mmol) and tris-(trimethylsilyl)-silyllithium-3-tetrahydrofuranate (339 mg, 0.722 mmol). The resulting yellowish powdery polysilane (3.4 g, yield 70%) was calcined to produce a brown thin film having a conductivity of $10^{-3}$ s/cm.

EXAMPLE 8

The procedure of Example 1 was followed except for the use of alpha-phenethyldisilane (6.65 g, 40 mmol) as the starting monomer and hydridocarbonyl-tris (triphenylphosphine)rhodium (573 mg, 0.624 mmol) as the catalyst. There was obtained a brown powdery polysilane (5.4 g, yield 82%), which upon calcination formed a brown thin film having a conductivity of $10^{-2}$ s/cm.

EXAMPLE 9

The procedure of Example 1 was followed except for the use of β-phenethyldisilane (6.65 g, 40 mmol) as the starting monomer and a mixture of chlorocarbonyl-bis-(triphenylphosphine)iridium (5µmg, 0.705mmol) and tris-(trimethylsiyl)-silyllithium-3-tetrahydrofuranate (339 mg, 0.722 mmol). The resulting light yellow powdery polysilane (3.5 g, yield 52%) was calcined to produce a brown thin film having a conductivity of $10^{-6}$ s/cm.

EXAMPLE 10

The procedure of Example 1 was followed except that the starting monomer 1,3-di-n-hexyltrisilane (2.08 g, 8.0 mmol) was reacted in the presence of a catalyst comprising dichloro-bis-(triphenylphosphine)nickel (90 mg, 0.138 mmol), potassium hydride (12 mg, 0.29 mmol) and 18-crown-6 (27 mg, 0.101 mmol). There was obtained a light yellow powdery polysilane (1.51 g, yield 73%) having a conductivity of $10^{-1}$ s/cm.

EXAMPLE 11

The procedure of Example 1 was followed except for the use of benzyldisilane (2.03 g, 13 mmol) as the starting monomer and a mixture of dichloro-bis-(triphenylphosphine) palladium (150 mg, 0.230 mmol) and tris-(trimethylsilyl)-silyllithium-3-tetrahydrofuranate (218 mg, 0.463 mmol) as the catalyst. The resulting light yellow powdery polysilane (0.71 g, yield 35%) had a conductivity of $10^{-2}$ s/cm.

EXAMPLE 12

The procedure of Example 1 was followed except for the use of cyclohexylsilane (4.57 g, 40 mmol) as the starting monomer and cis-dichloro-bis-(triphenylphosphine) platinum (541 mg, 0.684 mmol) as the catalyst. There was obtained a brown powdery polysilane (3.66 g, yield 80%) which upon calcination exhibited a conductivity of $10^{-6}$ s/cm.

EXAMPLE 13

The procedure of Example 3 was followed except that the catalyst comprised of 346 mg (1.34 mmols) of dichloro-bis-cyclopentadienyl zirconium and 55.4 mg (1.46 mmols) of lithium aluminum hydride was used. There was obtained a dark brown solid polysilane (11.0 g, 82% yield, Mw=4600 and Mw/Mn=2.4 in terms of polystyrene by GPC). The resulting polymer was dissolved in xylene to make a 10 mass % solution which was then spin-coated on 5×5 cm quartz substrate and calcined at 600° C. for 3 hours in the presence of a flow of 100% hydrogen at 2 l/min. There was obtained a transparent dark brown film measuring of 0.2 μm thick (by contact stylus method) which had an optical band-gap (Eo) of 1.7 eV. Its silicon concentration was 87.7 atomic % and its carbon concentration was 12.3 atomic % (ESCA).

EXAMPLE 14

The procedure of Example 3 was followed except that the catalyst comprised of 338 mg (1.15 mmols) of dichloro-bis-cyclopentadienyl zirconium and 70 mg (2.8 mmols) of sodium deuteride and the staring monomer comprised of 10.8 g (0.106 mol) of 1,2-dimethylpropylsilane and 2.28 g (0.071 mols) of silane were used. There was obtained a crude polymer (25.8 g, yield 20%). This crude polymer was dissolved in toluene and the resulting solution was passed through a column packed with strongly acidic cation exchange resin (Diaion RCP 160M) to obtain a treated solution. After concentrating the solution, there was obtained an orange solid polymer (1.91 g, yield 74%, Mw=27600 and Mw/Mn=5.7 in terms of polystyrene by GPC).

The resulting polymer was treated according to the same procedure as in Example 13 to obtain a dark transparent film having a thickness of 0.1 μm (by contact stylus method) and an optical band-gap (Eo) of 1.6 eV. Its silicon concentration was 94.4 atomic % and its carbon concentration was 5.6 atomic % (ESCA).

EXAMPLE 15

The procedure of Example 1 was followed except that a catalyst comprised of 174 mg (0.594 mmols) of dichloro-bis-cyclopentadienyl zirconium and 377 mg (0.843 mmols) of triphenylsilyllithium-3-tetrahydrofuranate was used. There was obtained a yellowish viscous oil (4.05 g, yield 93%).

The oil was treated according to the same procedure as in Example 1 to obtain a transparent brown film having a thickness of 0.13 μm (by contact stylus method) and an optical band-gap (Eo) of 1.9 eV. Its silicon concentration was 57.2 atomic % and its carbon concentration was 42.8 atomic %.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for producing a semiconducting material which comprises subjecting a hydrosilane monomer to dehydrogenative condensation followed by thermal decomposition to provide a semiconducting material containing silicon in an amount of 60 atomic % or more, where the hydrosilane monomer is selected from the group consisting of hydromonosilane, hydrodisilane and hydrotrisilane, and the hydromonosilane has the formula (I)

wherein $R^1$ and $R^2$ each are independently selected from the group consisting of hydrogen, $C_1$–$C_{12}$ alkyl, $C_3$–$C_{12}$ cycloalkyl, $C_1$–$C_{12}$ halogenated alkyl, $C_7$–$C_{12}$ aralkyl, $C_7$–$C_{12}$ halogenated aralkyl, $C_6$–$C_{12}$ aryl, $C_7$–$C_{12}$ alkyl substituted aryl, and silyl groups of the formula (I')

wherein $R^3$, $R^4$ and $R^5$ each are independently selected from the group consisting of $C_1$–$C_8$ alkyl, $C_3$–$C_{10}$ aryl and $C_7$–$C_{10}$ alkyl-substituted aryl;

the hydrodisilane has the formula (II)

wherein $R^6$–$R^{10}$ are independently selected from the group consisting of hydrogen, $C_1$–$C_{12}$ alkyl, $C_3$–$C_{12}$ cycloalkyl, $C_1$–$C_{12}$ halogenated alkyl, $C_7$–$C_{12}$ aralkyl, $C_7$–$C_{12}$ halogenated aralkyl, $C_6$–$C_{12}$ aryl, $C_7$–$C_{12}$ alkyl substituted aryl, and silyl groups of the formula (I'), wherein at least one of $R_6$–$R_{10}$ is hydrogen;

and the hydrotrisilane has the formula (III)

wherein $R^{11}$–$R^{17}$ each are independently selected from the group consisting of hydrogen, $C_1$–$C_{12}$ alkyl, $C_3$–$C_{12}$ cycloalkyl, $C_1$–$C_{12}$ halogenated alkyl, $C_7$–$C_{12}$ aralkyl, $C_7$–$C_{12}$ halogenated aralkyl, $C_6$–$C_{12}$ aryl, $C_7$–$C_{12}$ alkyl substituted aryl, and silyl groups of the formula (I'), wherein at least one of $R^{11}$–$R^{17}$ is hydrogen.

wherein said dehydrogenative condensation occurs upon contacting the hydrosilane monomer with a catalyst comprising at least one metal or metal compound of Groups 3B, 4B and 8 of the Periodic Table, in an amount of 0.01–10 moles of catalyst per 100 moles of the hydrosilane monomer, under conditions including a temperature of 0° C.–400° C. and a pressure of 1 mmHg to 200 kg/cm² for a time of 5 minutes to 72 hours, to provide a condensate; and said thermal decomposition results upon exposing the condensate to a temperature of 200° C.–1000° C. in an atmosphere selected from the group consisting of an inert gas, a reducing atmosphere or a vacuum of $10^{-5}$–$10^{-4}$ pa.

2. The method according to claim 1, wherein said metal or metal compound is selected from the group consisting of titanium, zirconium, hafnium, ruthenium, cobalt, rhodium, iridium, nickel, palladium and platinum.

3. The method according to claim 1 wherein said semiconducting material contains silicon in an amount of 70 atomic % or more.

4. The method according to claim 1 wherein said dehydrogenative condensation is conducted at a temperature of 0° C. to 250° C.

5. The method according to claim 1 wherein said dehydrogenative condensation is conducted for a time of 5 minutes to 24 hours.

6. The method according to claim 1 wherein said catalyst is combined with a silyl compound of the formula (IV)

$$R^{18}R^{19}R^{20}SiA \quad (IV)$$

wherein $R^{18}$, $R^{19}$ and $R^{20}$ each are selected from the group consisting of $C_1$–$C_{12}$ alkyl, $C_7$–$C_{12}$ aralkyl, $C_6$–$C_{12}$ aryl and silyl groups of the formula (I'), and A is selected from the group consisting of Li, Na and K, in a molar ratio of said catalyst to said silyl compound of 1:0.01–1:100.

7. The method according to claim 1 wherein said catalyst is combined with a metal hydride or deuteride selected from the group consisting of LiX, NaX, KX, $CaX_2$, $AlX_3$, $R^{21}_{(3-p)}AlX_p$, $LiAlX_4$, $LiAlR^{22}_{(4-q)}X_q$, $NaAlR^{22}_{(4-q)}X_q$, Li(9-BBN)X, $NaBX_4$, $KBX_4$ and $(R^{21})_4N$—$BX_4$, wherein X is independently hydrogen or deuterium at each occurrence, $R^{21}$ is independently $C_1$–$C_5$ alkyl at each occurrence, p is 1 or 2, $R^{22}$ is independently $C_1$–$C_8$ alkyl or $C_1$–$C_8$ alkoxy where either the alkyl or alkoxy group contains 0–2 oxygen atoms present as an ether group at each occurrence, and q is 1, 2 or 3 in a molar ratio of said catalyst to said metal hydride or deuteride of 1:0.01–1:100.

8. The method according to claim 1 wherein said semiconducting material is a film.

9. The method according to claim 8, wherein said film is cast over a sheet selected from the group consisting of quartz, stainless steel and a silicon wafer.

10. The method according to claim 8, wherein said film has a thickness of 0.01 μm–500 μm.

11. The method according to claim 8, wherein said film has a thickness of 0.1 μm–50 μm.

12. The method according to claim 1, wherein the thermal decomposition temperature is in the range of 200° C.–700° C.

13. The method according to claim 1, wherein said semiconducting material has an optical band-gap (EO) of 0.1–2.0 eV.

* * * * *